United States Patent
Xu et al.

(10) Patent No.: US 10,680,550 B2
(45) Date of Patent: Jun. 9, 2020

(54) CASCADED PHOTOVOLTAIC GRID-CONNECTED INVERTER, CONTROL METHOD AND CONTROL DEVICE FOR THE SAME

(71) Applicant: SUNGROW POWER SUPPLY CO., LTD., Hefei, Anhui (CN)

(72) Inventors: Jun Xu, Anhui (CN); Tao Zhao, Anhui (CN); Yilei Gu, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 555 days.

(21) Appl. No.: 15/474,022

(22) Filed: Mar. 30, 2017

(65) Prior Publication Data
US 2017/0294875 A1    Oct. 12, 2017

(30) Foreign Application Priority Data

Apr. 11, 2016   (CN) .......................... 2016 1 0225285

(51) Int. Cl.
*H02S 40/32*   (2014.01)
*H01L 31/05*   (2014.01)
(Continued)

(52) U.S. Cl.
CPC .......... *H02S 40/32* (2014.12); *H01L 31/0508* (2013.01); *H02J 3/16* (2013.01);
(Continued)

(58) Field of Classification Search
CPC .......... H02S 40/32; H02S 40/36; H02J 3/383; H02J 3/16; H02J 2003/001;
(Continued)

(56) References Cited

U.S. PATENT DOCUMENTS

| | | | |
|---|---|---|---|
| 2009/0161398 A1 | 6/2009 | Benaboud et al. | |
| 2015/0357933 A1* | 12/2015 | Li | H02M 7/49 307/52 |

FOREIGN PATENT DOCUMENTS

| | | |
|---|---|---|
| CN | 103997249 A | 8/2014 |
| CN | 104092245 A | 10/2014 |
| CN | 105356469 A | 2/2016 |
| JP | H05260762 A | 10/1993 |

(Continued)

OTHER PUBLICATIONS

JP Notification of Reasons for Refusal corresponding to Application No. JP2017-067792; dated Jun. 5, 2018.

(Continued)

*Primary Examiner* — Rexford N Barnie
*Assistant Examiner* — Thai H Tran
(74) *Attorney, Agent, or Firm* — Cantor Colburn LLP

(57) ABSTRACT

Provided are a cascaded photovoltaic grid-connected inverter, a control method and a control device for the same. The method includes: determining whether at least one of inverter units of the cascaded photovoltaic grid-connected inverter is over-modulated; injecting a reactive current to a power grid to make a grid-connected current effective value greater than or equal to $\sqrt{2}*i_{dcmin}$, in a case that at least one of the inverter units is over-modulated; determining a voltage $U_0$ required for grid connection for the cascaded photovoltaic grid-connected inverter corresponding to a current grid-connected current effective value; and adjusting an output active voltage of each of the inverter units according to $U_{jd}=P_j/P_0*U_{0d}$, and adjusting an output reactive voltage of each of the inverter units in a case that none of the inverter units is over-modulated.

10 Claims, 4 Drawing Sheets

(51) Int. Cl.
*H02J 3/16* (2006.01)
*H02J 3/38* (2006.01)
*H02S 40/36* (2014.01)
*H02M 7/49* (2007.01)
*H02M 1/42* (2007.01)
*H02M 1/00* (2006.01)

(52) U.S. Cl.
CPC .............. *H02J 3/383* (2013.01); *H02M 7/49* (2013.01); *H02S 40/36* (2014.12); *H02M 1/42* (2013.01); *H02M 2001/0077* (2013.01); *Y02B 70/12* (2013.01); *Y02E 10/563* (2013.01)

(58) Field of Classification Search
CPC ....... H01L 31/0508; H02M 7/49; H02M 1/42; Y02B 70/12; Y02E 10/563
See application file for complete search history.

(56) References Cited

FOREIGN PATENT DOCUMENTS

| | | |
|---|---|---|
| JP | 2008061356 A | 3/2008 |
| JP | 2009542171 A | 11/2009 |
| WO | 9618937 A | 6/1996 |

OTHER PUBLICATIONS

Extended European Search Report for corresponding Application No. 17162926.4-1804; dated Sep. 7, 2017.
Liming Liu et al., "Reactive Power Compensation and Optimization Strategy for Grid-Interactive Cascaded Photovoltaic Systems," IEEE Transactions on Power Electronics, Institute of Electrical and Electronics Engineers, vol. 30, No. 1, pp. 188-202; Jun. 25, 2014.
SIPO Summary of the First Office Action for corresponding Application No. 201610225285.8; dated Oct. 10 2017.

* cited by examiner

CASCADED PHOTOVOLTAIC GRID-CONNECTED INVERTER, CONTROL METHOD AND CONTROL DEVICE FOR THE SAME

CROSS REFERENCE TO RELATED APPLICATION

The present application claims the priority to Chinese Patent Application No. 201610225285.8, titled "CASCADED PHOTOVOLTAIC GRID-CONNECTED INVERTER, CONTROL METHOD AND CONTROL DEVICE FOR THE SAME", filed on Apr. 11, 2016 with the State Intellectual Property Office of the PRC, which is incorporated herein by reference in its entirety.

TECHNICAL FIELD

The present disclosure relates to the field of power electronic technology, and in particular to a cascaded photovoltaic grid-connected inverter, a control method and a control device for the cascaded photovoltaic grid-connected inverter.

BACKGROUND

A cascaded photovoltaic grid-connected inverter includes n cascaded inverter units (such as an H-bridge inverter unit), and a topological structure of the cascaded photovoltaic grid-connected inverter is shown in FIG. 1. A direct current side of each of the inverter units is connected with an independent photovoltaic array, and alternating current sides of the inverter units are connected in series, and then connected with a power grid through a filtering inductor L.

A conventional control strategy of the cascaded photovoltaic grid-connected inverter is described as follows. Each of the inverter units independently performs maximum power point tracking, stabilizes a direct current bus voltage and uploads a power signal to a total controller. The total controller calculates a grid-connected current instruction value based on all power signals, and then achieves an effective control of the current of the power grid by using a PR controller.

However, the conventional control strategy is easy to result in an inverter unit over-modulation phenomenon in a case that output active powers between the inverter units are seriously unbalanced. For example, when an output power of a photovoltaic array corresponding to an inverter unit #1 decreases due to uneven lighting or other factors, an output active power Pi of the inverter unit #1 is inevitably reduced according to a principle of active power conservation, thereby causing decrease in a grid-connected current effective value. After the grid-connected current effective value is decreased, output voltages of inverter units #2 to # n are respectively increased in order to maintain the active power conservation of the inverter units #2 to # n. In a case that an output voltage of a certain inverter unit exceeds a direct current bus voltage of the inverter unit (that is, a modulation degree of the inverter unit is greater than 1), an over-modulation phenomenon occurs in the invert unit, thereby resulting in a negative impact on the grid-connected operation stability of the cascaded photovoltaic grid-connected inverter.

SUMMARY

In a view of the above, the present disclosure provides a cascaded photovoltaic grid-connected inverter, a control method and a control device for the cascaded photovoltaic grid-connected inverter, so that the cascaded photovoltaic grid-connected inverter can still keep grid-connected operation stability in a case that output active powers between various inverter units are seriously unbalanced.

A control method for a cascaded photovoltaic grid-connected inverter is provided according to the disclosure. The control method includes: determining whether at least one of inverter units of the cascaded photovoltaic grid-connected inverter is over-modulated; injecting a reactive current to a power grid to make a grid-connected current effective value greater than or equal to $\sqrt{2}*i_{dcmax}$, with $i_{dcmax}$ being a maximum value of output currents of photovoltaic arrays, in a case that at least one of the inverter units of the cascaded photovoltaic grid-connected inverter is over-modulated; determining a voltage $U_0$ required for grid connection for the cascaded photovoltaic grid-connected inverter corresponding to a current grid-connected current effective value; and adjusting an output active voltage of each of the inverter units according to $U_{jd}=P_j/P_0*U_{0d}$, and adjusting an output reactive voltage of each of the inverter units in a case that none of the inverter units is over-modulated, where a sum of the output reactive voltage of each of the inverter units is equal to $U_{0p}$, $U_{0d}$ is an active component of $U_0$ and $U_{0p}$ is a reactive component of $U_0$, $P_j$ and $U_{jd}$ are respectively an output active power and an output active voltage of a same inverter unit, and $P_0$ is a sum of the output active power of each of the inverter units.

The injecting the reactive current to the power grid may include: injecting an inductive reactive current to the power grid.

The injecting the reactive current to the power grid may include: injecting a capacitive reactive current to the power grid.

The determining whether at least one of the inverter units of the cascaded photovoltaic grid-connected inverter is over-modulated may include: determining whether the grid-connected current effective value is less than $\sqrt{2}*i_{dcmax}$, and determining that at least one of the inverter units of the cascaded photovoltaic grid-connected inverter is over-modulated in a case that the grid-connected current effective value is less than $\sqrt{2}*i_{dcmax}$.

The injecting the reactive current to the power grid to make the grid-connected current effective value greater than or equal to $\sqrt{2}*i_{dcmax}$ may include: injecting the reactive current to the power grid to make the grid-connected current effective value equal to $\sqrt{2}*i_{dcmax}$.

A control device for a cascaded photovoltaic grid-connected inverter is provided according to the disclosure. The control device includes: a determining unit, a reactive injecting unit, a voltage determining unit and a voltage allocating unit. The determining unit is configured to determine whether at least one of inverter units of the cascaded photovoltaic grid-connected inverter is over-modulated. The reactive injecting unit is configured to inject a reactive current to a power grid to make a grid-connected current effective value greater than or equal to $\sqrt{2}*i_{dcmax}$, with $i_{dcmax}$ being a maximum value of output currents of photovoltaic arrays, in a case that the determining unit determines that at least one of the inverter units of the cascaded photovoltaic grid-connected inverter is over-modulated. The voltage determining unit is configured to, after an operation of the reactive injecting unit is completed, determine a voltage $U_0$ required for grid connection for the cascaded photovoltaic grid-connected inverter corresponding to a current grid-connected current effective value. The voltage allocating unit is configured to, after the voltage determining unit determines the voltage $U_0$, adjust an output active voltage of each of the inverter units according to $U_{jd}=P_j/P_0*U_{0d}$, and adjust an output reactive voltage of each of the inverter units in a case that none of the inverter units is over-modulated, where a sum of the output reactive voltage of each of the inverter units is equal to $U_{0p}$, $U_{0d}$ is an active component of $U_0$ and $U_{0p}$ is a reactive component of $U_0$, $P_j$ and $U_{jd}$ are respectively an output active power and an output active voltage of a same inverter unit, and $P_0$ is a sum of the output active power of each of the inverter units.

The reactive injecting unit may be configured to inject an inductive reactive current to the power grid to make the grid-connected current effective value greater than or equal to $\sqrt{2}*i_{dcmax}$, in a case that the determining unit determines that at least one of the inverter units of the cascaded photovoltaic grid-connected inverter is over-modulated; or the reactive injecting unit may be configured to inject a capacitive reactive current to the power grid to make the grid-connected current effective value greater than or equal to $\sqrt{2}*i_{dcmax}$, in a case that the determining unit determines that at least one of the inverter units of the cascaded photovoltaic grid-connected inverter is over-modulated.

The determining unit may be configured to determine whether the grid-connected current effective value is less than $\sqrt{2}*i_{dcmax}$, and determine that at least one of the inverter units of the cascaded photovoltaic grid-connected inverter is over-modulated in a case that the grid-connected current effective value is less than $\sqrt{2}*i_{dcmax}$.

The reactive injecting unit may be configured to inject the reactive current to the power grid to make the grid-connected current effective value equal to $\sqrt{2}*i_{dcmax}$, in a case that the determining unit determines that at least one of the inverter units of the cascaded photovoltaic grid-connected inverter is over-modulated.

A cascaded photovoltaic grid-connected inverter including the control device for the cascaded photovoltaic grid-connected inverter described above is provided according to the disclosure.

As can be seen from the above technical solutions, when an inverter unit is over-modulated, a moderate reactive current is injected to the power grid. Since an active voltage needed to be outputted by each inverter unit is decreased after the reactive current is injected, a larger output reactive voltage is allocated to an inverter unit of which an output active voltage is smaller, and a smaller output reactive voltage is allocated to an inverter unit of which an output active voltage is larger, so that a modulation degree of each inverter unit is not greater than 1, thereby maintaining the grid-connected operation stability of the cascaded photovoltaic grid-connected inverter.

BRIEF DESCRIPTION OF THE DRAWINGS

The accompany drawings used in the description of the embodiments or the conventional technology are described briefly as follows, so that the technical solutions according to the embodiments in the present disclosure or according to the conventional technology become clearer. It is apparent that the accompany drawings in the following description show only some embodiments of the present disclosure. For those skilled in the art, other accompany drawings may be obtained according to these accompany drawings without any creative work.

DETAILED DESCRIPTION OF THE EMBODIMENTS

The technical solution according to the embodiments of the present disclosure will be described clearly and completely as follows in conjunction with the accompany drawings in the embodiments of the present disclosure. It is apparent that the described embodiments are only a part of the embodiments according to the present disclosure. All the other embodiments obtained by those skilled in the art based on the embodiments in the present disclosure without any creative work belong to the protection scope of the present disclosure.

Figure 1:
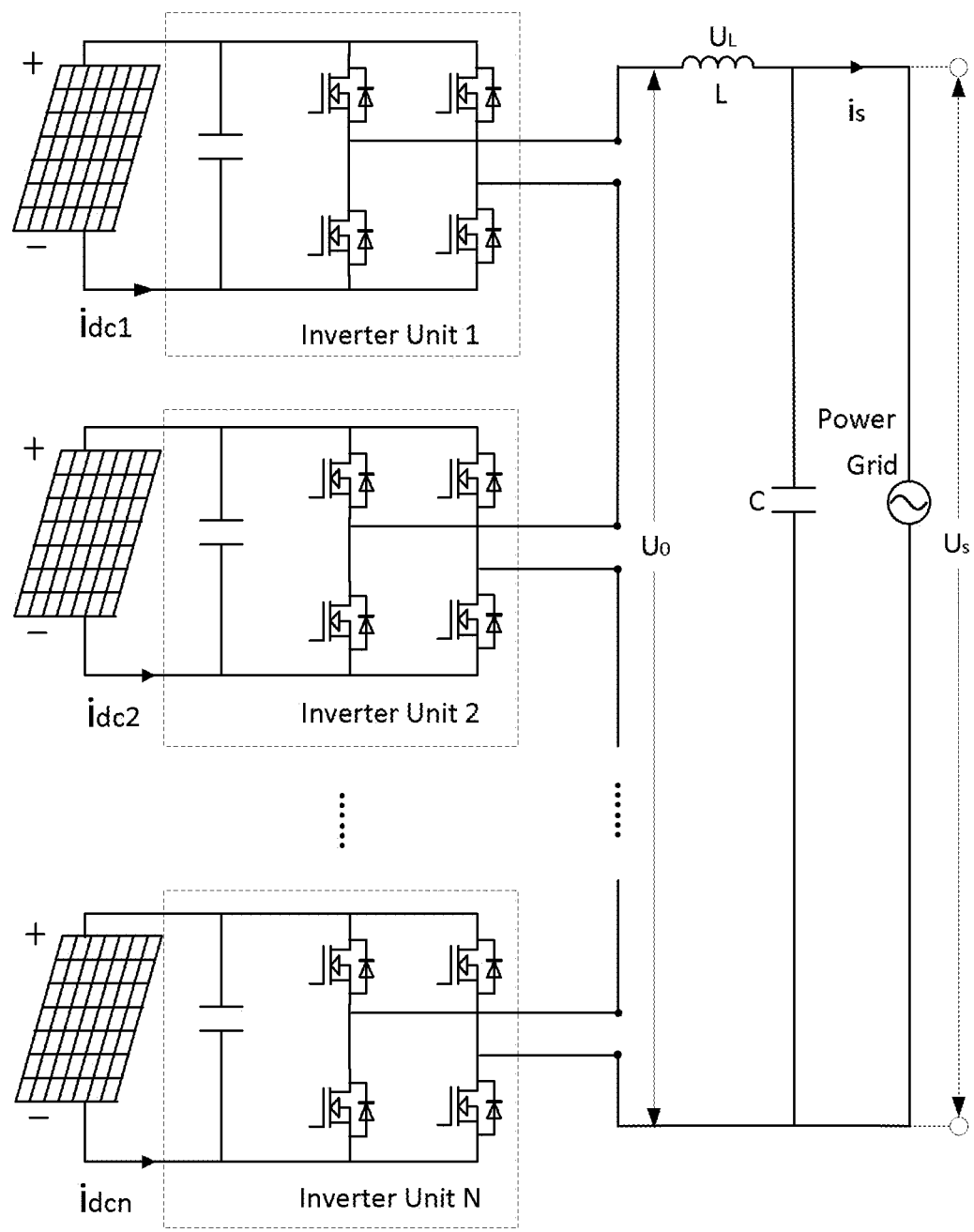
FIG. 1 is a schematic structural diagram of a cascaded photovoltaic grid-connected inverter disclosed in the conventional art.
Figure 2:
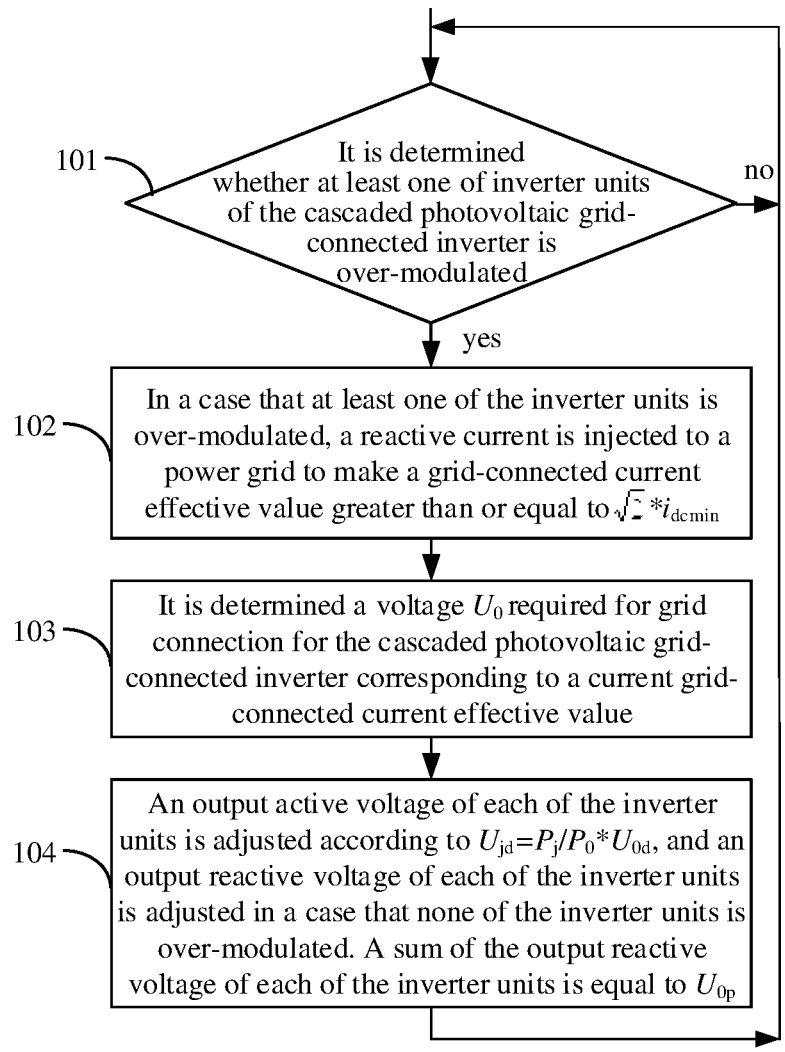
FIG. 2 is a flow chart of a control method for a cascaded photovoltaic grid-connected inverter according to an embodiment of the disclosure.

Referring to FIG. 2, a control method for a cascaded photovoltaic grid-connected inverter is provided according to an embodiment of the present disclosure, so that the cascaded photovoltaic grid-connected inverter can still keep grid-connected operation stability in a case that output active powers between various inverter units are seriously unbalanced. The control method includes steps 101 to 104.

In step 101, it is determined whether at least one of inverter units of the cascaded photovoltaic grid-connected inverter is over-modulated. In a case that there is at least one inverter unit over-modulated, it is necessary to switch a control logic of a total controller, and then step 102 is performed. In a case that none of the inverter units is over-modulated, current control logic of the total controller is not improved, and step 101 is performed again.

In a case that the output active powers between the inverter units are seriously unbalanced, it is easy to result in an inverter unit over-modulation phenomenon. The inverter unit over-modulation phenomenon means that an output voltage peak of an inverter unit exceeds a direct current bus voltage value of the inverter unit, that is, a modulation degree m of the inverter unit is greater than 1. Correspondingly, when determining whether at least one of the inverter units of the cascaded photovoltaic grid-connected inverter is over-modulated, it may be determined that at least one of the inverter units of the cascaded photovoltaic grid-connected inverter is over-modulated based on an output voltage peak of at least one of the inverter units exceeds the direct current bus voltage value of the inverter unit. That is, it may be determined that at least one of the inverter units of the cascaded photovoltaic grid-connected inverter is over-modulated based on the modulation degree m of at least one of the inverter units is greater than 1.

In addition, it may be determined that at least one of the inverter units of the cascaded photovoltaic grid-connected inverter is over-modulated based on a grid-connected current effective value $i_s<\sqrt{2}*i_{dcmax}$ ($i_{dcmax}$ is a maximum value of output currents of photovoltaic arrays). Specifically, a derivation process is described as follows. It is known that an inverter unit # j (j=1, 2, 3, . . . , n) meets an active power conservation formula $U_{dcj}*i_{dcj}=i_s*u_j$ ($U_{dcj}$ and $i_{dcj}$ are respectively a direct current bus voltage value and a direct current bus current value of the inverter unit # j, $u_j$ is an output voltage effective value of the inverter unit # j, and $i_s$ is a grid-connected current effective value), and a modulation degree $m_j$ of the inverter unit # j is $m_j=u_j*\sqrt{2}/u_{dcj}$, then $u_{dcj}*i_{dcj}=i_s*m_j*u_{dcj}/\sqrt{2}$ can be deduced. It can be seen by analysis that, $m_j>1$ when $i_s<\sqrt{2}*i_{dcj}$. Therefore, in a case that $i_s$ is less than a maximum value of direct current bus current values of inverter units #1 to # n (that is, a maximum value of output currents of photovoltaic arrays), it is determined that at least one of the inverter units of the cascaded photovoltaic grid-connected inverter is over-modulated.

In step 102, in a case that at least one of the inverter units of the cascaded photovoltaic grid-connected inverter is over-modulated, a reactive current is injected to a power grid to make a grid-connected current effective value greater than or equal to $\sqrt{2}*i_{dcmax}$, $i_{dcmax}$ is a maximum value of output currents of photovoltaic arrays.

In step 103, it is determined a voltage $U_0$ required for grid connection for the cascaded photovoltaic grid-connected inverter corresponding to a current grid-connected current effective value.

In step 104, an output active voltage of each of the inverter units is adjusted according to $U_{jd}P_j/P_0*U_{0d}$, and an output reactive voltage of each of the inverter units is adjusted in a case that none of the inverter units is over-modulated. A sum of the output reactive voltage of each of the inverter units is equal to $U_{0p}$. $U_{0d}$ is an active component of $U_0$ and $U_{0p}$ is a reactive component of $U_0$. $P_j$ and $U_{jd}$ are respectively an output active power and an output active voltage of a same inverter unit. And $P_0$ is a sum of the output active power of each of the inverter units.

In a case that there is at least one inverter unit over-modulated, it is necessary to inject a moderate reactive current to the power grid. A modulation degree of each inverter unit may be reduced no matter whether the injected reactive current is an inductive reactive current or a capacitive reactive current, so that the cascaded photovoltaic grid-connected inverter can still keep grid-connected operation stability in a case that output active powers between various inverter units are seriously unbalanced. Hereinafter, two reactive current injection schemes are described in detail.

Figure 3:
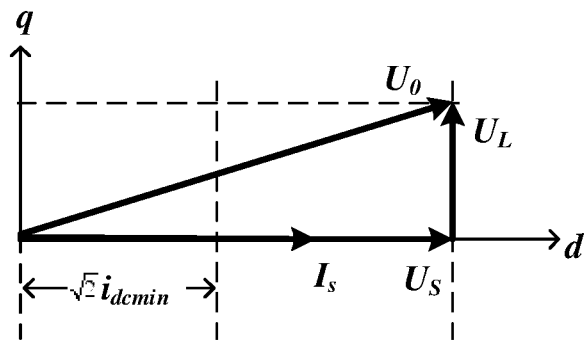
FIG. 3 is a working vector diagram of a cascaded photovoltaic grid-connected inverter under a conventional control strategy.

First, a working vector diagram of a cascaded photovoltaic grid-connected inverter before the reactive current is injected to the power grid is shown in FIG. 3. A grid voltage vector $U_s$ is in a same phase with a grid-connected current vector $I_s$ (a module value of each vector in the specification refers to an effective value). A filtering inductor voltage vector $U_L$ leads the grid-connected current vector $I_s$ by 90° in phase. A vector of the voltage required for grid connection of the cascaded photovoltaic grid-connected inverter is $U_0=U_s+U_L$. A dq coordinate system is established by taking $I_s$ as a d axis, $U_s$ and $U_L$ are an active component and a reactive component of $U_0$ respectively. In a case that the grid-connected current effective value $i_s$ is less than $\sqrt{2}*i_{dcmax}$, an inverter unit over-modulation phenomenon occurs, it is necessary to immediately inject the reactive current to the power grid, to meet $i_s \geq \sqrt{2}*i_{dcmax}$ under a precondition that the cascaded photovoltaic grid-connected inverter can keep grid-connected operation stability.

1) An Inductive Reactive Current is Injected to the Power Grid

Figure 4:
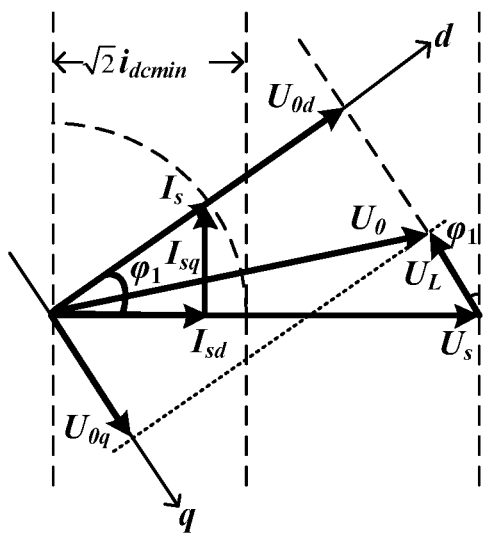
FIG. 4 is a working vector diagram of a cascaded photovoltaic grid-connected inverter after an inductive reactive current is injected to a power grid.

A working vector diagram of a cascaded photovoltaic grid-connected inverter after the inductive reactive current is injected to the power grid is shown in FIG. 4, and a drawing process of FIG. 4 is analyzed hereinafter.

(1) The grid voltage vector $U_s$ is determined. Before and after the inductive reactive current is injected to the power grid, an amplitude and a direction of the grid voltage vector $U_s$ remain the same.

(2) The grid voltage vector $I_s$ is determined. The inductive reactive current is injected to the power grid to make a module value of the grid-connected current vector $I_s$ greater than or equal to $\sqrt{2}*i_{dcmax}$ (in this embodiment, the module value of the grid-connected current vector $I_s$ is equal to $\sqrt{2}*i_{dcmax}$, and there is a grid power factor angle $\varphi_1$). And an active component $I_{sd}$ of the grid-connected current vector $I_s$ is in a same phase with the grid voltage vector $U_s$, and a reactive component $I_{sq}$ (i.e., a vector of the inductive reactive current injected to the power grid) of the grid-connected current vector $I_s$ leads $I_s$ by 90° in phase.

(3) The filtering inductor voltage vector $U_L$ is determined. The filtering inductor voltage vector $U_L$ leads $I_s$ by 90° in phase, and after the grid voltage vector $I_s$ is known, a module value of $U_L$ may be calculated according to an inductor voltage formula.

(4) The vector $U_0$ of the voltage required for grid connection of the cascaded photovoltaic grid-connected inverter is $U_0=U_s+U_L$. The dq coordinate system is established by taking $I_s$ as a d axis, an active component $U_{0d}$ and a reactive component $U_{0p}$ of $U_0$ in the dq coordinate system may be obtained. The total controller allocates the output active voltage of each inverter unit according to $U_{jd}=P_j/P_0*U_{0d}$, a sum of output active voltages of all the inverter units is equal to $U_{0d}$. In addition, an output reactive voltage of the each inverter unit is assigned in a condition of ensuring that none of the inverter units is over-modulated, and a sum of output reactive voltages of all the inverter units is equal to $U_{jp}$.

2) A Capacitive Reactive Current is Injected to the Power Grid

Figure 5:
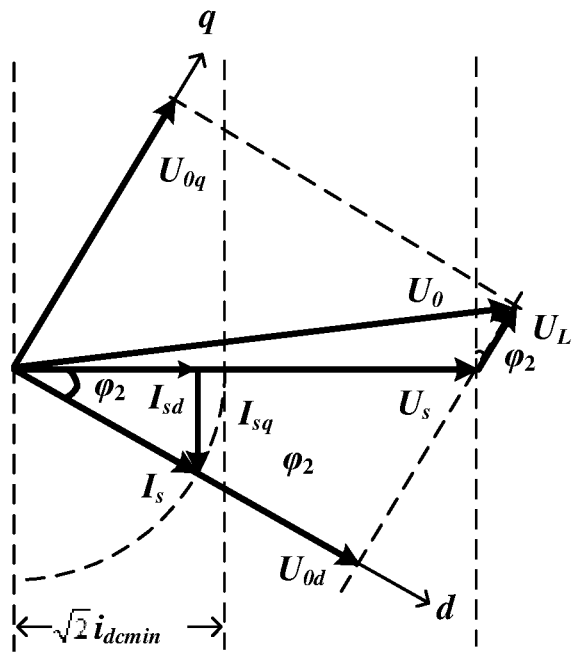
FIG. 5 is a working vector diagram of a cascaded photovoltaic grid-connected inverter after a capacitive reactive current is injected to a power grid.

A working vector diagram of a cascaded photovoltaic grid-connected inverter after the capacitive reactive current is injected to the power grid is shown in FIG. 5, and a drawing process of FIG. 5 is analyzed hereinafter.

(1) The grid voltage vector $U_s$ is determined. Before and after the capacitive reactive current is injected to the power grid, an amplitude and a direction of the grid voltage vector $U_s$ remain the same.

(2) The grid voltage vector $I_s$ is determined. The capacitive reactive current is injected to the power grid to make a module value of the grid-connected current vector $I_s$ greater than or equal to $\sqrt{2}*i_{dcmax}$ (in this embodiment, the module value of the grid-connected current vector $I_s$ is equal to $\sqrt{2}*i_{dcmax}$, and there is a grid power factor angle $\varphi_2$, $\varphi_2=-\varphi_1$). And an active component $I_{sd}$ of the grid-connected current vector $I_s$ is in a same phase with the grid voltage vector $U_s$, and a reactive component $I_{sq}$ (i.e., a vector of the capacitive reactive current injected to the power grid) of the grid-connected current vector $I_s$ lags the grid-connected current vector $I_s$ by 90° in phase.

(3) The filtering inductor voltage vector $U_L$ is determined. The filtering inductor voltage vector $U_L$ leads $I_s$ by 90° in phase, and a module value of $U_L$ may be calculated based on grid voltage vector $I_s$.

(4) The vector $U_0$ of the voltage required for grid connection of the cascaded photovoltaic grid-connected inverter is $U_0=U_s+U_L$. The dq coordinate system is established by taking $I_s$ as a d axis, an active component $U_{Od}$ and a reactive component $U_{Op}$ of $U_O$ in the dq coordinate system may be obtained. The total controller allocates the output active voltage of each inverter unit according to $U_{jd}=P_j/P_0*U_{Od}$, a sum of output active voltages of all the inverter units is equal to $U_{Od}$. In addition, an output reactive voltage of the each inverter unit is assigned in a condition of ensuring that none of the inverter units is over-modulated, and a sum of output reactive voltages of all the inverter units is equal to $U_{jp}$.

As can be seen by analyzing contents of 1) and 2), the total controller reallocates the output active voltage of the each inverter unit according to $U_{jd}=P_j/P_0*U_{Od}$, whether the inductive reactive current or the capacitive reactive current is injected. Referring to FIG. 3 to FIG. 5, it can be found that, since a model value of $U_{Od}$ after the inductive (or capacitive) reactive current is injected is significantly reduced compared with a model value of $U_s$ before the inductive (or capacitive) reactive current is injected, the output active voltage required to be allocated to the each inverter unit will be reduced. And allocation of $U_{Op}$ is more flexible, a larger output reactive voltage is allocated to an inverter unit of which an output active voltage is smaller, and a smaller output reactive voltage is allocated to an inverter unit of which an output active voltage is larger, so that a module value of a vector sum of an active modulation degree and a reactive modulation degree of the each inverter unit (i.e., the modulation degree of the each inverter unit) is not greater than 1. Therefore, an inverter unit over-modulation phenomenon does not occur, thereby maintaining the grid-connected operation stability of the cascaded photovoltaic grid-connected inverter.

Of course, the more the injected inductive (or capacitive) reactive powers is, the lower the output efficiency of the cascaded photovoltaic grid-connected inverter is, therefore in a condition of ensuring that none of the modulation degrees of all the inverter units is greater than 1, the less the injected reactive power the better. It is known that the more the injected reactive power is, the greater an absolute value of the grid power factor angle is. As can be seen from FIG. 4 and FIG. 5, the absolute value of the grid power factor angle is $$|\varphi_1|=|\varphi_2|=\tan^{-1}(\sqrt{|I_s|^2-|I_{sd}|^2}/|I_{sd}|).$$

And in a case that the grid-connected current effective value $i_s\sqrt{2}*i_{dcmax}$, the absolute value of the grid power factor angle is the smallest, therefore in the embodiment, the reactive current is injected to the power grid with $i_s\sqrt{2}*i_{dcmax}$ as the standard.

Figure 6:
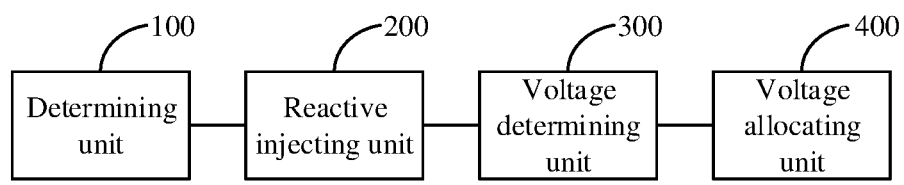
FIG. 6 is a schematic structural diagram of a control device for a cascaded photovoltaic grid-connected inverter according to an embodiment of the disclosure.

Referring to FIG. 6, a control device for a cascaded photovoltaic grid-connected inverter is provided according to an embodiment of the present disclosure, so that the cascaded photovoltaic grid-connected inverter can still keep grid-connected operation stability in a case that output active powers between various inverter units are seriously unbalanced. The control device includes a determining unit 100, a reactive injecting unit 200, a voltage determining unit 300 and a voltage allocating unit 400.

The determining unit 100 is configured to determine whether at least one of inverter units of the cascaded photovoltaic grid-connected inverter is over-modulated.

The reactive injecting unit 200 is configured to inject a reactive current to a power grid to make a grid-connected current effective value greater than or equal to $\sqrt{2}*i_{dcmax}$, with $i_{dcmax}$ being a maximum value of output currents of photovoltaic arrays, in a case that the determining unit 100 determines that at least one of the inverter units of the cascaded photovoltaic grid-connected inverter is over-modulated.

The voltage determining unit 300 is configured to, after an operation of the reactive injecting unit 200 is completed, determine a voltage $U_O$ required for grid connection for the cascaded photovoltaic grid-connected inverter corresponding to a current grid-connected current effective value.

The voltage allocating unit 400 is configured to, after the voltage determining unit 300 determines the voltage $U_O$, adjust an output active voltage of each of the inverter units according to $U_{jd}=P_j/P_0*U_{Od}$, and adjust an output reactive voltage of each of the inverter units in a case that none of the inverter units is over-modulated, where a sum of the output reactive voltage of each of the inverter units is equal to $U_{Op}$, $U_{Od}$ is an active component of $U_O$ and $U_{Op}$ is a reactive component of $U_O$, $P_j$ and $U_{jd}$ are respectively an output active power and an output active voltage of a same inverter unit, and $P_0$ is a sum of the output active power of each of the inverter units.

The reactive injecting unit 200 is configured to inject an inductive reactive current to the power grid to make the grid-connected current effective value greater than or equal to $\sqrt{2}*i_{dcmax}$, in a case that the determining unit 100 determines that at least one of the inverter units of the cascaded photovoltaic grid-connected inverter is over-modulated. Alternatively, the reactive injecting unit 200 is configured to inject a capacitive reactive current to the power grid to make the grid-connected current effective value greater than or equal to $\sqrt{2}*i_{dcmax}$, in a case that the determining unit 100 determines that at least one of the inverter units of the cascaded photovoltaic grid-connected inverter is over-modulated.

The determining unit 100 is configured to determine whether the grid-connected current effective value is less than $\sqrt{2}*i_{dcmax}$, and determine that at least one of the inverter units of the cascaded photovoltaic grid-connected inverter is over-modulated in a case that the grid-connected current effective value is less than $\sqrt{2}*i_{dcmax}$.

The reactive injecting unit 200 is configured to inject the reactive current to the power grid to make the grid-connected current effective value equal to $\sqrt{2}*i_{dcmax}$, in a case that the determining unit determines that at least one of the inverter units of the cascaded photovoltaic grid-connected inverter is over-modulated.

In addition, it is provided according to the disclosure a cascaded photovoltaic grid-connected inverter including the control device for the cascaded photovoltaic grid-connected inverter described above.

In summary, when an inverter unit is over-modulated, a moderate reactive current is injected to the power grid. Since an active voltage needed to be outputted by each inverter unit is decreased after the reactive current is injected, a larger output reactive voltage is allocated to an inverter unit of which an output active voltage is smaller, and a smaller output reactive voltage is allocated to an inverter unit of which an output active voltage is larger, so that a modulation degree of each inverter unit is not greater than 1, thereby maintaining the grid-connected operation stability of the cascaded photovoltaic grid-connected inverter.

The embodiments of the present disclosure are described herein in a progressive manner, with an emphasis placed on explaining the difference between each embodiment and the other embodiments; hence, for the same or similar parts among the embodiments, they can be referred to from one another. For the device disclosed in the embodiments, the corresponding descriptions are relatively simple because the device corresponds to the method disclosed in the embodiments. The relevant portions may be referred to the description for the method parts.

The above description of the embodiments disclosed herein enables those skilled in the art to implement or use the present disclosure. Numerous modifications to the embodiments will be apparent to those skilled in the art, and the general principle herein can be implemented in other embodiments without deviation from the spirit or scope of the embodiments of the present disclosure. Therefore, the present disclosure will not be limited to the embodiments described herein, but in accordance with the widest scope consistent with the principle and novel features disclosed herein.

The invention claimed is:

1. A control method for a cascaded photovoltaic grid-connected inverter, comprising:
    determining that at least one of inverter units of the cascaded photovoltaic grid-connected inverter is over-modulated based on a grid-connected current effective value being less than $\sqrt{2}*i_{dcmax}$, wherein $i_{dcmax}$ is a maximum value of output currents of photovoltaic arrays;
    injecting a reactive current to a power grid to make the grid-connected current effective value greater than or equal to $\sqrt{2}*i_{dcmax}$ in a case that at least one of the inverter units of the cascaded photovoltaic grid-connected inverter is over-modulated;
    determining a voltage $U_0$ required for grid connection for the cascaded photovoltaic grid-connected inverter corresponding to a current grid-connected current effective value; and
    adjusting an output active voltage of each of the inverter units according to $U_{jd}=P_j/P_0*U_{0d}$, and adjusting an output reactive voltage of each of the inverter units in a case that none of the inverter units is over-modulated, wherein a sum of the output reactive voltage of each of the inverter units is equal to $U_{0p}$, $U_{0d}$ is an active component of $U_0$ and $U_{0p}$ is a reactive component of $U_0$, $P_j$ and $U_{jd}$ are respectively an output active power and an output active voltage of a same inverter unit, and $P_0$ is a sum of the output active power of each of the inverter units.

2. The control method for the cascaded photovoltaic grid-connected inverter according to claim 1, wherein the injecting the reactive current to the power grid comprises: injecting an inductive reactive current to the power grid.

3. The control method for the cascaded photovoltaic grid-connected inverter according to claim 1, wherein the injecting the reactive current to the power grid comprises: injecting a capacitive reactive current to the power grid.

4. The control method for the cascaded photovoltaic grid-connected inverter according to claim 1, wherein the injecting the reactive current to the power grid to make the grid-connected current effective value greater than or equal to $\sqrt{2}*i_{dcmax}$ comprises: injecting the reactive current to the power grid to make the grid-connected current effective value equal to $\sqrt{2}*i_{dcmax}$.

5. A control device for a cascaded photovoltaic grid-connected inverter, comprising:
    a determining unit, configured to determine that at least one of inverter units of the cascaded photovoltaic grid-connected inverter is over-modulated based on a grid-connected current effective value being less than $\sqrt{2}*i_{dcmax}$, wherein $i_{dcmax}$ is a maximum value of output currents of photovoltaic arrays;
    a reactive injecting unit, configured to inject a reactive current to a power grid to make the grid-connected current effective value greater than or equal to $\sqrt{2}*i_{dcmax}$ in a case that the determining unit determines that at least one of the inverter units of the cascaded photovoltaic grid-connected inverter is over-modulated;
    a voltage determining unit, configured to, after an operation of the reactive injecting unit is completed, determine a voltage $U_0$ required for grid connection for the cascaded photovoltaic grid-connected inverter corresponding to a current grid-connected current effective value; and
    a voltage allocating unit, configured to, after the voltage determining unit determines the voltage $U_0$, adjust an output active voltage of each of the inverter units according to $U_{jd}=P_j/P_0*U_{0d}$, and adjust an output reactive voltage of each of the inverter units in a case that none of the inverter units is over-modulated, wherein a sum of the output reactive voltage of each of the inverter units is equal to $U_{0p}$, $U_{0d}$ is an active component of $U_0$ and $U_{0p}$ is a reactive component of $U_0$, $P_j$ and $U_{jd}$ are respectively an output active power and an output active voltage of a same inverter unit, and $P_0$ is a sum of the output active power of each of the inverter units.

6. The control device for the cascaded photovoltaic grid-connected inverter according to claim 5, wherein
    the reactive injecting unit is configured to inject an inductive reactive current to the power grid to make the grid-connected current effective value greater than or equal to $\sqrt{2}*i_{dcmax}$, in a case that the determining unit determines that at least one of the inverter units of the cascaded photovoltaic grid-connected inverter is over-modulated; or
    the reactive injecting unit is configured to inject a capacitive reactive current to the power grid to make the grid-connected current effective value greater than or equal to $\sqrt{2}*i_{dcmax}$, in a case that the determining unit determines that at least one of the inverter units of the cascaded photovoltaic grid-connected inverter is over-modulated.

7. The control device for the cascaded photovoltaic grid-connected inverter according to claim 5, wherein the reactive injecting unit is configured to inject the reactive current to the power grid to make the grid-connected current effective value equal to $\sqrt{2}*i_{dcmax}$, in a case that the determining unit determines that at least one of the inverter units of the cascaded photovoltaic grid-connected inverter is over-modulated.

8. A cascaded photovoltaic grid-connected inverter comprising a control device for a cascaded photovoltaic grid-connected inverter, wherein the control device for the cascaded photovoltaic grid-connected inverter comprises:
    a determining unit, configured to determine that at least one of inverter units of the cascaded photovoltaic grid-connected inverter is over-modulated based on a grid-connected current effective value being less than $\sqrt{2}*i_{dcmax}$, wherein $i_{dcmax}$ is a maximum value of output currents of photovoltaic arrays;
    a reactive injecting unit, configured to inject a reactive current to a power grid to make the grid-connected current effective value greater than or equal to $\sqrt{2}*i_{dcmax}$ in a case that the determining unit determines that at least one of the inverter units of the cascaded photovoltaic grid-connected inverter is over-modulated;

a voltage determining unit, configured to, after an operation of the reactive injecting unit is completed, determine a voltage $U_0$ required for grid connection for the cascaded photovoltaic grid-connected inverter corresponding to a current grid-connected current effective value; and a voltage allocating unit, configured to, after the voltage determining unit determines the voltage $U_0$, adjust an output active voltage of each of the inverter units according to $U_{jd}=P_j/P_0*U_{0d}$, and adjust an output reactive voltage of each of the inverter units in a case that none of the inverter units is over-modulated, wherein a sum of the output reactive voltage of each of the inverter units is equal to $U_{0p}$, $U_{0d}$ is an active component of $U_0$ and $U_{0p}$ is a reactive component of $U_0$, $P_j$ and $U_{jd}$ are respectively an output active power and an output active voltage of a same inverter unit, and $P_0$ is a sum of the output active power of each of the inverter units.

9. The cascaded photovoltaic grid-connected inverter according to claim 8, wherein the reactive injecting unit is configured to inject an inductive reactive current to the power grid to make the grid-connected current effective value greater than or equal to $\sqrt{2}*i_{dcmax}$, in a case that the determining unit determines that at least one of the inverter units of the cascaded photovoltaic grid-connected inverter is over-modulated; or the reactive injecting unit is configured to inject a capacitive reactive current to the power grid to make the grid-connected current effective value greater than or equal to $\sqrt{2}*i_{dcmax}$, in a case that the determining unit determines that at least one of the inverter units of the cascaded photovoltaic grid-connected inverter is over-modulated.

10. The cascaded photovoltaic grid-connected inverter according to claim 8, wherein the reactive injecting unit is configured to inject the reactive current to the power grid to make the grid-connected current effective value equal to $\sqrt{2}*i_{dcmax}$, in a case that the determining unit determines that at least one of the inverter units of the cascaded photovoltaic grid-connected inverter is over-modulated.

* * * * *